United States Patent
Idaka et al.

(10) Patent No.: US 7,960,764 B2
(45) Date of Patent: Jun. 14, 2011

(54) SEMICONDUCTOR DEVICE MANUFACTURING METHOD AND SEMICONDUCTOR DEVICE

(75) Inventors: Toshiaki Idaka, Kanagawa-ken (JP); Kazuyuki Yahiro, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/805,940

(22) Filed: Aug. 25, 2010

(65) Prior Publication Data

US 2010/0320512 A1 Dec. 23, 2010

Related U.S. Application Data

(62) Division of application No. 12/408,593, filed on Mar. 20, 2009, now Pat. No. 7,803,706.

(30) Foreign Application Priority Data

May 15, 2008 (JP) ................................. 2008-128073

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)
*H01L 23/58* (2006.01)

(52) U.S. Cl. ................. 257/288; 257/649; 257/E29.155

(58) Field of Classification Search ................. 257/288, 257/649, E29.155
See application file for complete search history.

(56) References Cited

U.S. PATENT DOCUMENTS

| 7,053,400 | B2 | 5/2006 | Sun et al. |
| 2006/0189075 | A1 | 8/2006 | Kanno |
| 2007/0096184 | A1 | 5/2007 | Akamatsu |
| 2007/0278589 | A1 | 12/2007 | Tamura et al. |
| 2008/0128823 | A1 | 6/2008 | Takeoka |
| 2009/0152639 | A1 | 6/2009 | Bu et al. |
| 2009/0218629 | A1 | 9/2009 | Wieczorek et al. |
| 2010/0012992 | A1 | 1/2010 | Pidin |

FOREIGN PATENT DOCUMENTS

JP 2006-237070 9/2006

*Primary Examiner* — David S Blum
(74) *Attorney, Agent, or Firm* — Finnegan, Henderson, Farabow, Garrett & Dunner, L.L.P.

(57) ABSTRACT

Disclosed is a semiconductor device manufacturing method in which a silicon nitride film is formed to cover an n-channel transistor formed on a semiconductor substrate and to apply a tensile stress in a channel length direction to a channel of the n-channel transistor, the method includes: forming a first-layer silicon nitride film above the n-channel transistor; irradiating the first-layer silicon nitride film with ultraviolet radiation; and after the ultraviolet irradiation, forming at least one silicon nitride film thinner than the first-layer silicon nitride film above the first-layer silicon nitride film. Silicon nitride films formed to apply the tensile stress is formed by respective steps.

5 Claims, 2 Drawing Sheets

ULTRAVIOLET RADIATION

ULTRAVIOLET RADIATION

SEMICONDUCTOR DEVICE MANUFACTURING METHOD AND SEMICONDUCTOR DEVICE

This is a division of application Ser. No. 12/408,593, filed Mar. 20, 2009, now U.S. Pat. No. 7,803,706, which is incorporated herein by reference.

CROSS-REFERENCE TO RELATED APPLICATIONS

This application is based upon and claims the benefit of priority from the prior Japanese Patent Application No. 2008-128073, filed on May 15, 2008; the entire contents of which are incorporated herein by reference.

BACKGROUND OF THE INVENTION

1. Field of the Invention

This invention relates to a semiconductor device manufacturing method and a semiconductor device.

2. Background Art

Recently, with the growing demand for the performance of semiconductor transistors, it has been difficult to improve the performance simply by downscaling the transistors, and new technologies have been under development. In one of such technologies, a silicon nitride film, in which a relatively high internal stress is easily obtained, is formed on the semiconductor substrate so as to cover the gate structure so that the stress is applied to the channel below the gate to increase the carrier mobility (see JP-A-2006-237070(Kokai)).

It is known that the carrier mobility of an n-channel transistor increases when a tensile stress in the channel length direction acts on the channel. When a tensile stress in the channel length direction acts on the channel of the n-channel transistor, the silicon nitride film itself needs to have an internal stress in the shrinking direction. However, the possibility of cracking due to this shrinkage is a concern to be addressed.

SUMMARY OF THE INVENTION

According to an aspect of the invention, there is provided a semiconductor device manufacturing method in which a silicon nitride film is formed to cover an n-channel transistor formed on a semiconductor substrate and to apply a tensile stress in a channel length direction to a channel of the n-channel transistor, the method including: (A) forming a first-layer silicon nitride film above the n-channel transistor; (B) irradiating the first-layer silicon nitride film with ultraviolet radiation; and (C) after the ultraviolet irradiation, forming at least one silicon nitride film thinner than the first-layer silicon nitride film above the first-layer silicon nitride film, silicon nitride films formed to apply the tensile stress being formed by respective steps.

According to another aspect of the invention, there is provided a semiconductor device including: an n-channel transistor formed on a semiconductor substrate; and a plurality of silicon nitride films covering the n-channel transistor and applying a tensile stress in a channel length direction to a channel of the n-channel transistor, the silicon nitride films including: a first-layer silicon nitride film formed above the n-channel transistor; and one or more silicon nitride film formed above the first-layer silicon nitride film, the one or more silicon nitride film being thinner and having higher hydrogen content per unit volume than the first-layer silicon nitride film respectively.

DETAILED DESCRIPTION OF THE INVENTION

Figure 1A:
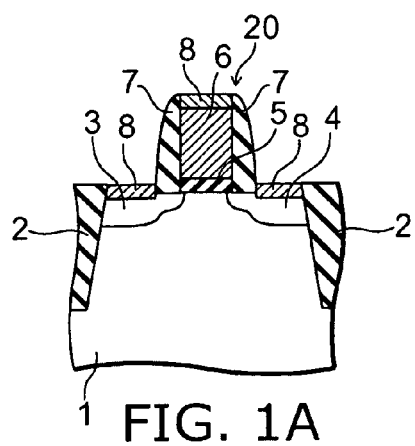
FIGS. 1A to 1E are schematic views showing forming silicon nitride films in a semiconductor device manufacturing method according to an embodiment of the invention.

Embodiments of the invention will now be described with reference to the drawings. In the drawings, like elements are labeled with like reference numerals.

FIG. 1 is a schematic view showing major steps in a semiconductor device manufacturing method according to an embodiment of the invention.

The semiconductor device manufacturing method according to this embodiment includes the steps of forming a transistor 20 on a semiconductor substrate (e.g., silicon substrate) 1 and forming silicon nitride films 11, 12 above the transistor 20.

The transistor 20 is an n-channel FET (field effect transistor), which includes an n-type source region 3 and an n-type drain region 4 selectively formed in the superficial portion of the semiconductor substrate 1. A gate electrode (e.g., polycrystalline silicon) 6 is provided via a gate dielectric film (e.g., silicon oxide film) 5 on the region (p-type region) between the source region 3 and the drain region 4. When a desired gate voltage is applied to the gate electrode 6, an n-type channel (inversion layer) is formed in the region between the source region 3 and the drain region 4, and electrical conduction is established between the source region 3 and the drain region 4 through the channel.

A silicide film 8 is formed on each surface of the source region 3 and the drain region 4, and also on the surface of the gate electrode 6. These silicide films 8 decrease the resistance of each surface of the source region 3, the drain region 4, and the gate electrode 6.

A plurality of transistors 20 are formed on the semiconductor substrate 1, and isolated from each other by a device isolation layer 2 having the STI (shallow trench isolation) structure, for example. Before the transistor 20 is formed, a trench is formed in the semiconductor substrate 1, and silicon oxide is illustratively buried inside the trench to form the device isolation layer 2.

In forming the transistor 20, when the patterning of the gate structure (the stacked structure of the gate dielectric film 5 and the gate electrode 6) is completed, it is first used as a mask to perform ion implantation to form a shallow diffusion region in the surface of the semiconductor substrate 1. Subsequently, a sidewall dielectric layer 7 is formed on the side surface of the gate structure, and then ion implantation is performed again to form a deep diffusion region in the surface of the semiconductor substrate 1. Thus, the source region 3 and the drain region 4 are formed in the surface of the semiconductor substrate 1.

Next, a metal film is formed entirely on the semiconductor substrate 1, and then heat treatment is performed. By this heat treatment, the metal reacts with silicon in the portion where the metal film is in contact with the source region 3, the drain region 4, and the gate electrode 6, and a compound film of the metal and silicon, that is, a silicide film 8, is formed in that portion.

Through the steps described above, the transistor 20 is formed on the semiconductor substrate 1 as shown in FIG. 1A.

Next, a silicon nitride film serving as a stress liner is formed on the semiconductor substrate 1 so as to cover the transistor 20. A commonly used method for forming the silicon nitride film is a plasma CVD (chemical vapor deposition) method, in which radio-frequency power is applied to a gas atmosphere containing silane gas and ammonia gas to generate a plasma, thereby depositing a silicon nitride film on a surface subjected to film formation.

Depending on the film formation condition, the silicon nitride film can be controlled whether to have an internal stress that applies a compressive stress to the channel or to have an internal stress that applies a tensile stress to the channel.

The carrier (electron) mobility of an n-channel transistor increases when a tensile stress in the channel length direction (the direction connecting between the source region and the drain region) acts on the channel. To form a silicon nitride film that applies this tensile stress to the channel, a silicon nitride film highly containing hydrogen is formed by plasma CVD using a material gas containing hydrogen, and then hydrogen is desorbed from the film by ultraviolet irradiation of the film. Desorption of hydrogen from the film causes the film itself to shrink.

Figure 1B:
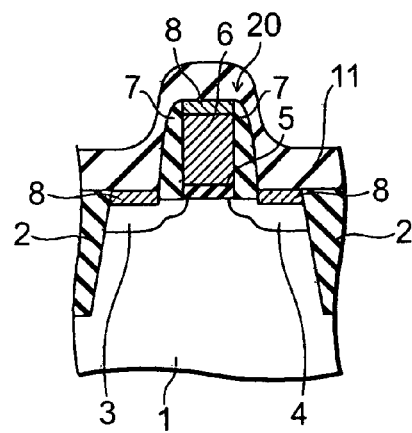
Figure 1C:
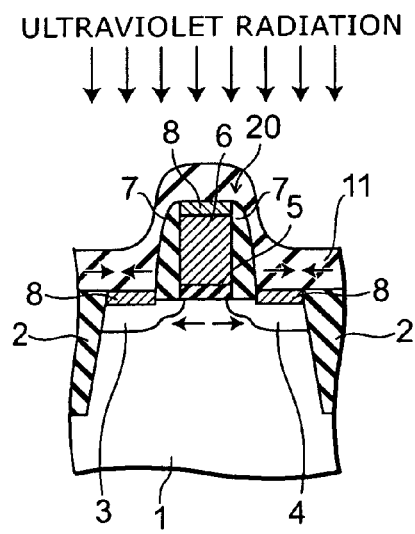

In the silicon nitride film 11 shown in FIG. 1C, when the portion located along the substrate surface on the lateral side of the sidewall dielectric layer 7 shrinks in the substrate surface direction indicated by the arrows, a tensile stress acts on the channel in the channel length direction.

Figure 3:
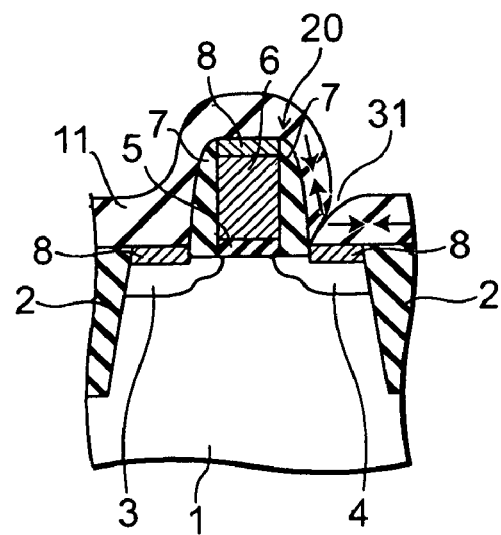
FIG. 3 is a schematic cross-sectional view showing the condition of crack occurred in a silicon nitride film in a semiconductor device of a comparative example.

The silicon nitride film 11 is formed so as to coat the step portion between the substrate surface and the gate structure. However, the film growth rate decreases at the corner portion in the step coating, and hence that portion tends to be more brittle than the other portion. When the film shrinks upon ultraviolet irradiation, as shown in FIG. 3, the portion along the substrate surface shrinks in the substrate surface direction, and the portion covering the sidewall dielectric layer 7 shrinks vertically. Hence, a tensile stress acts on the corner portion therebetween. Furthermore, this portion is brittle as described above. Thus, a crack 31 is likely to occur in the aforementioned corner portion, which is close to the channel. The crack 31 in this portion decreases the stress acting on the channel, and interferes with the improvement of transistor performance through increased carrier mobility.

When the crack 31 occurs, a crevice is first produced on the film surface, and expands downward. Thus, in this embodiment, the occurrence of cracks is prevented by reducing the amount of shrinkage in the film surface where a crevice is otherwise first produced.

In the following, a method for forming a silicon nitride film in the embodiment of the invention is described.

In this embodiment, a plurality of silicon nitride films are formed in a plurality of steps. In the example described below, two silicon nitride films 11, 12 are formed in two steps.

First, as shown in FIG. 1B, a first silicon nitride film 11 is formed as a first-layer silicon nitride film on the semiconductor substrate 1. The first silicon nitride film 11 covers the transistor 20 so as to coat the step portion between the substrate surface and the gate structure.

The first silicon nitride film 11 is formed by plasma CVD. The film formation chamber is supplied with a material gas containing monosilane ($SiH_4$) gas at a flow rate of 60 sccm, ammonia ($NH_3$) gas at 900 sccm, and nitrogen ($N_2$) gas at 1000 sccm, and the pressure in the film formation chamber is maintained at $1.133 \times 10^3$ Pa. A radio-frequency power of 100 W is applied to the electrodes provided in the film formation chamber. During film formation, the semiconductor substrate 1 is heated to approximately 300° C. The first silicon nitride film 11 formed in this plasma CVD process contains the hydrogen (H) element resulting from the material gas, besides the silicon (Si) element and the nitrogen (N) element.

By controlling the film formation time, the first silicon nitride film 11 is formed to a thickness of e.g. 50 nm (nanometers).

Next, as shown in FIG. 1C, the first silicon nitride film 11 is irradiated with ultraviolet radiation. After the first silicon nitride film 11 is formed, the wafer (the semiconductor substrate 1 with the transistor 20 formed thereon) is carried out of the film formation chamber and carried into an ultraviolet irradiation chamber. This carriage is performed under a reduced-pressure atmosphere, and ultraviolet irradiation in the ultraviolet irradiation chamber is also performed under a reduced-pressure atmosphere. Hence, during the time from the film formation process until completion of the ultraviolet irradiation process, the first silicon nitride film 11 is not exposed to the air. Furthermore, during the ultraviolet irradiation process, the wafer is illustratively heated to approximately 400° C.

By ultraviolet irradiation of the first silicon nitride film 11, hydrogen in the film is desorbed therefrom in the form of H—N groups and Si—H groups. This desorption of hydrogen from the film causes the first silicon nitride film 11 to shrink and apply a tensile stress in the channel length direction to the channel as described above.

Conventionally, this completes the process of forming the silicon nitride film, and the wafer is exposed to the air. At this time, the temperature decrease of the silicon nitride film due to exposure to the air causes the film to shrink, and is likely to cause cracks.

Figure 1D:
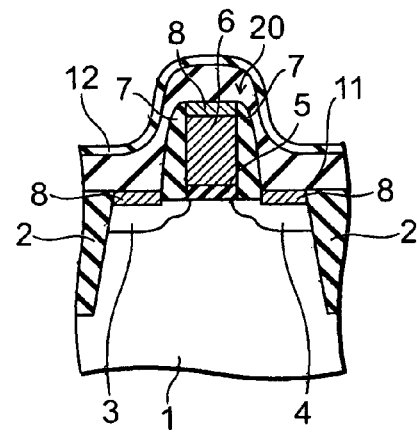

In contrast, in this embodiment, after ultraviolet irradiation of the first silicon nitride film 11, the wafer is carried again into the film formation chamber under a reduced-pressure atmosphere without exposure to the air, and a second silicon nitride film 12 in the second layer is formed (FIG. 1D).

The second silicon nitride film 12 is also formed by plasma CVD, and the condition therefor is also the same as that in forming the first silicon nitride film 11. However, the film formation time is shorter than in forming the first silicon nitride film 11, and controlled so that the second silicon nitride film 12 has a smaller thickness, e.g. 10 nm, than the first silicon nitride film 11 (50 nm).

Figure 1E:
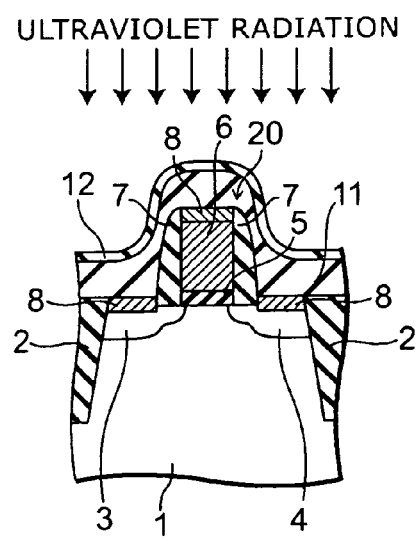

Next, as shown in FIG. 1E, the second silicon nitride film 12 is irradiated with ultraviolet radiation. Also during this ultraviolet irradiation process for the second silicon nitride film 12, the wafer is illustratively heated to approximately 400° C.

Like the first silicon nitride film 11, by ultraviolet irradiation of the second silicon nitride film 12, hydrogen in the film is desorbed therefrom in the form of H—N groups and Si—H groups. This desorption of hydrogen from the film causes the second silicon nitride film 12 to shrink and apply a tensile stress in the channel length direction to the channel as described above.

As the time of ultraviolet irradiation of the silicon nitride film containing hydrogen increases, the hydrogen content in the film decreases. However, the decrease eventually saturates and reaches a limiting point where the hydrogen content in the film scarcely varies despite any further ultraviolet irradiation.

The first silicon nitride film 11 is subjected to ultraviolet irradiation close to the limiting point. This irradiation time depends on the film thickness. For example, it is approximately 450 seconds for a film thickness of 50 nm.

In contrast, the second silicon nitride film 12 is thinner than the first silicon nitride film 11. Thus, the hydrogen content in the film is originally lower than in the first silicon nitride film 11, and the time to reach the aforementioned limiting point is shorter than for the first silicon nitride film 11. Furthermore, in this embodiment, the function as a stress liner for applying a stress to the channel is mostly assigned to the first silicon nitride film 11, and for the second silicon nitride film 12, the ultraviolet irradiation time is restricted to be shorter than the limiting point corresponding to the film thickness in order to reduce the amount of shrinkage to avoid cracks. For example, in this embodiment, the ultraviolet irradiation time for the second silicon nitride film 12 is approximately 90 seconds. Hence, after the ultraviolet irradiation process, the hydrogen content per unit volume is higher in the second silicon nitride film 12 than in the first silicon nitride film 11.

The first silicon nitride film 11. has a larger thickness (larger volume) than the second silicon nitride film 12, and the total amount of hydrogen desorbed from the entire film is larger than for the second silicon nitride film 12, because ultraviolet irradiation is performed close to the aforementioned limiting point. Hence, the amount of shrinkage is also larger by that amount.

In contrast, for the second silicon nitride film 12, the total amount of hydrogen desorbed from the entire film is smaller than for the first silicon nitride film 11, and the amount of film shrinkage is also smaller. At the time of atmospheric exposure, the surface of the second silicon nitride film 12 is exposed to the air. The small amount of shrinkage of the second silicon nitride film 12 serves to avoid surface cracks due to shrinkage, thereby avoiding cracks in the underlying first silicon nitride film 11 which primarily functions as a stress liner.

Furthermore, the series of processes of the film formation of a first silicon nitride film 11, ultraviolet irradiation of the first silicon nitride film 11, the film formation of a second silicon nitride film 12, and ultraviolet irradiation of the second silicon nitride film 12 is continuously performed in a reduced-pressure atmosphere without exposure to the air. Hence, the surface of the first silicon nitride film 11 having a large amount of shrinkage is not exposed to the air, and can avoid the associated rapid temperature decrease. This also contributes to avoiding cracks.

The wafer with the first silicon nitride film 11 and the second silicon nitride film 12 formed thereon under the aforementioned condition was observed by optical microscope, and no cracks were identified.

As a comparative example, a silicon nitride film having a thickness of 60 nm was formed by plasma CVD under the condition like the foregoing. Before ultraviolet irradiation, the internal stress in the silicon nitride film itself was 0.5 GPa. However, by ultraviolet irradiation of this silicon nitride film, the internal stress was increased to 1.60 GPa.

In contrast, in the structure of the above embodiment where the first silicon nitride film 11 having a thickness of 50 nm and the second silicon nitride film 12 having a thickness of 10 nm are formed as described above, the internal stress of the entirety of these silicon nitride films was 1.59 GPa. Thus, a tensile stress nearly equal to that of the aforementioned comparative example can be applied to the channel.

That is, without increasing the total thickness of the silicon nitride films, this embodiment can impart a desired stress to the silicon nitride films, and also avoid cracks by restricting shrinkage at the film surface where cracks may otherwise originate. The amount of shrinkage is restricted only in the second silicon nitride film 12 on the film surface side, whereas for the first silicon nitride film 11 primarily functioning as a stress liner, the film thickness and the ultraviolet irradiation time are adjusted to achieve the desired internal stress. Hence, a suitable tensile stress can be applied to the channel of the n-channel transistor 20 in the channel length direction. Consequently, the carrier mobility can be increased, and the transistor performance can be improved.

In the first silicon nitride film 11 and the second silicon nitride film 12 formed by the above process, connecting holes (vias) are selectively formed in the portions located above the source region 3, the drain region 4, and the gate electrode 6. The source region 3, the drain region 4, and the gate electrode 6 are connected through the connecting holes to a source electrode, a drain electrode, and a gate interconnect, not shown, respectively.

As described above, in order to restrict the amount of shrinkage, the second silicon nitride film 12 has a smaller thickness than the first silicon nitride film 11, and the ultraviolet irradiation time is also shorter than for the first silicon nitride film 11. With the increase of the film thickness, the total amount of hydrogen desorbed from the film by ultraviolet irradiation increases by that amount, and the amount of film shrinkage increases. Hence, the thickness of the second silicon nitride film 12 is preferably 25% or less of that of the first silicon nitride film 11. In fact, as the result of fabrication using the film thickness satisfying this condition (the first silicon nitride film 11 having a thickness of 50 nm and the second silicon nitride film 12 having a thickness of 10 nm), the internal stress of the entire films achieved a desired stress (1.59 GPa), and no cracks occurred.

The function as a stress liner is mostly assigned to the first silicon nitride film 11, but if the second silicon nitride film 12 is also irradiated with ultraviolet radiation, the tensile stress acting on the channel can be increased relative to the case without such irradiation, and increased carrier mobility can be expected. However, the primary function of the second silicon nitride film 12 is not the function of a stress liner, but the function of restricting the amount of film surface shrinkage. Hence, ultraviolet irradiation of the second silicon nitride film 12 may be omitted.

Figure 2:
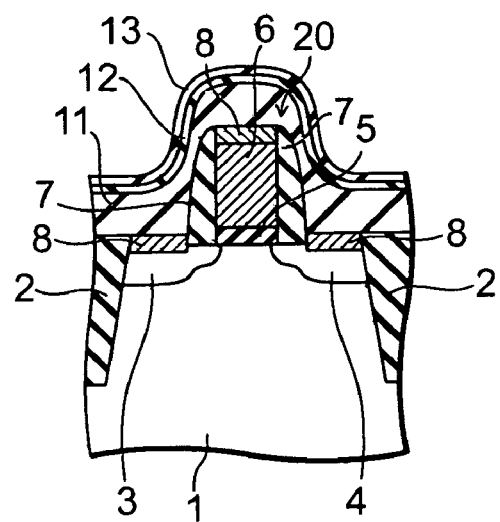
FIG. 2 is a schematic cross-sectional view of a semiconductor device according to another embodiment of the invention.

The number of silicon nitride films is not limited to two, but may be three or more. FIG. 2 shows an example in which three silicon nitride films are illustratively formed.

For example, the first silicon nitride film 11 has a thickness of 40 nm, the second silicon nitride film 12 formed thereon has a thickness of 10 nm, and the third silicon nitride film 13 formed thereon has a thickness of 10 nm. The total thickness of these silicon nitride films is the same as that in the above embodiment, 60 nm.

Also in the case of this structure, the thickness (10 nm) of each silicon nitride film in the second and subsequent layers, that is, each of the second silicon nitride film 12 and the third silicon nitride film 13, is 25% or less of the thickness (40 nm) of the first silicon nitride film 11 in the first layer which primarily functions as a stress liner. This serves to restrict the amount of shrinkage in each of the second silicon nitride film 12 and the third silicon nitride film 13, thereby avoiding cracks which may otherwise occur in these films provided on the surface side. Furthermore, the total thickness of the second and subsequent silicon nitride films (the second silicon nitride film 12 and the third silicon nitride film 13) is made thinner than that of the first silicon nitride film 11.

In this structure, illustratively by adjusting the ultraviolet irradiation time or film thickness, the amount of shrinkage can be made larger (hydrogen content per unit volume can be made lower) in the second silicon nitride film 12 than in the third silicon nitride film 13. Thus, between the first silicon nitride film 11 having a high internal stress and the third silicon nitride film 13 having a low internal stress, the second silicon nitride film 12 having an intermediate internal stress is interposed. Hence, prevention of trouble (such as peel-off at the film interface) due to internal stress difference can be expected. Furthermore, while avoiding cracks more reliably, the wafer heating temperature during ultraviolet irradiation can be increased to approximately 480° C. to further increase the internal stress of the entire silicon nitride films.

It is noted that the increase of the number of silicon nitride films results in increasing the number of repetition of the film formation process (CVD process) and the ultraviolet irradiation process. Hence, from the viewpoint of manufacturing efficiency and cost, it is preferable that the number of silicon nitride films be smaller.

The specific numerical values, process conditions, and materials mentioned in the foregoing description are illustrative only, and not limitative.

The invention claimed is:

1. A semiconductor device comprising:
   an n-channel transistor formed on a semiconductor substrate; and
   a plurality of silicon nitride films covering the n-channel transistor and applying a tensile stress in a channel length direction to a channel of the n-channel transistor, the silicon nitride films including:
      a first-layer silicon nitride film formed above the n-channel transistor; and
      one or more silicon nitride film formed above the first-layer silicon nitride film, the one or more silicon nitride film being thinner and having higher hydrogen content per unit volume than the first-layer silicon nitride film respectively.

2. The semiconductor device according to claim 1, wherein the n-channel transistor includes a gate electrode provided above a surface of the semiconductor substrate.

3. The semiconductor device according to claim 2, wherein the first-layer silicon nitride film coats a surface of the gate electrode and a step portion between the surface of the semiconductor substrate and the gate electrode.

4. The semiconductor device according to claim 1, wherein a respective thickness of the one or more silicon nitride film formed above the first-layer silicon nitride film is 25% or less of a thickness of the first-layer silicon nitride film.

5. The semiconductor device according to claim 1, wherein a total thickness of the one or more silicon nitride film formed above the first-layer silicon nitride film is thinner than a thickness of the first-layer silicon nitride film.

\* \* \* \* \*